United States Patent
Kang et al.

(10) Patent No.: US 6,320,794 B1
(45) Date of Patent: Nov. 20, 2001

(54) LATE-WRITE TYPE SEMICONDUCTOR MEMORY DEVICE WITH MULTI-CHANNEL DATA OUTPUT MULTIPLEXER

(75) Inventors: Tae-Kyun Kang, Inchon; Young-Dae Lee, Songnam, both of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/614,823

(22) Filed: Jul. 12, 2000

(30) Foreign Application Priority Data

Jul. 12, 1999  (KR) .................................................. 99-27974

(51) Int. Cl.[7] ...................................................... A11C 7/00
(52) U.S. Cl. .................. 365/189.02; 365/230.02
(58) Field of Search .......................... 365/189.02, 230.02, 365/233

(56) References Cited

U.S. PATENT DOCUMENTS 5,402,389 * 3/1995 Flannagan et al. .................. 365/233
5,717,653   2/1998 Suzuki .................................. 365/233

* cited by examiner

*Primary Examiner*—Terrell W. Fears
(74) *Attorney, Agent, or Firm*—Marger Johnson & McCollom, P.C.

(57) ABSTRACT

A multiplexer circuit of a late-write type semiconductor memory device for selectively outputting data to be bypassed to a data output buffer is constructed with at least one or more data channels. Each data channel includes a first switch for transmitting the data in response to a first state of a bypass control signal, a latch part for latching the data output through a first switch, and a second switch for transmitting the data output from the latch part in response to a second state of the bypass control signal. Thus the circuit prevents data errors and improves time interval of cycles in bypass operation at high speed.

18 Claims, 9 Drawing Sheets

LATE-WRITE TYPE SEMICONDUCTOR MEMORY DEVICE WITH MULTI-CHANNEL DATA OUTPUT MULTIPLEXER

CROSS REFERENCE TO RELATED APPLICATIONS

This application claims priority from Korean Priority Document No. 1999-27974, filed on Jun. 12, 1999 with the Korean Industrial Property Office, which document is hereby incorporated by reference.

BACKGROUND OF THE INVENTION

1. Field of the Invention

The present invention relates to a semiconductor memory device, and more particularly to a late-write type semiconductor memory device like a high speed static RAM (hereinafter referred to as SRAM).

2. Description of the Prior Art

A late-write type SRAM is one of a variety of prior arts concerning a synchronous type semiconductor memory device for high speed operations, where a total time required for write data reduces, resulting in an effect of improving margin of a write operation. One such SRAM is disclosed in U.S. Pat. No. 5,717, 653.

The semiconductor memory device delays a write address input from outside for a number of cycles in the course of performing a late-write process to input to an address decoder and to select word line and bit line. After the write address is input and delayed by a number of cycles, the data input signal input from outside is transmitted to a write driver. Then, the write operation is actuated after a number of cycles. In other words, for instance, in a two cycle late-write process of the semiconductor memory device, write data is input to perform the write operation after a write address is input and delayed by two cycles.

In addition, the conventional semiconductor memory device for high speed operation includes other functions like bypass operation as well as late-write operation. If a write command proceeds to a read command for a number of cycles and both of the write address and read address are identical, the semiconductor memory device performs a bypass operation by immediately outputting the previous write data through the data output buffer without going through a normal read operation of memory cells. However, in such devices there have been a number of data output errors in the high speed operation, rather than in the bypass operation. Some of the causes of these problems are described in detail later in this document. Therefore, the aforementioned data output errors make it difficult to reduce in the time interval of cycles in the bypass operation, so that the semiconductor memory device can not perform at high-speed operation. This limits efforts in improving the performance of the whole system.

SUMMARY OF THE INVENTION

Therefore, it is an object of the present invention to provide a late-write type semiconductor memory device to solve the aforementioned problems.

It is another object of the present invention to provide a late-write type static random access memory suitable for high-speed operation by reducing a time interval of cycles in bypass operation.

It is still another object of the present invention to provide a method for preventing data output errors and reducing a time interval of cycles in bypass operation, and a relevant multiplexer circuit for the late-write type semiconductor memory device.

It is further another object of the present invention to provide a static random access memory with a variety of bypass operation functions for smoothly performing two cycle late-write operation at high speed.

In order to accomplish the aforementioned objects of the present invention, there is provided a semiconductor memory device having a multiplexer circuit for selectively outputting data to be bypassed to a data output buffer. The circuit comprises data channels for channeling individual ones of the data signals prior to outputting to the data output buffer. At least one of the data channels includes:

a first switch for transmitting the first data signal in response to a first state of a first bypass control signal associated with the first data channel;

a latch part for latching the data signal output through the first switch of the first data channel; and a second switch for transmitting the data signal output from the latch part of the first data channel in response to a second state of the first bypass control signal.

In accordance with another object of the present invention, there is provided a method for channeling a single one of a plurality of data signals prior to selectively outputting one of the data signals to a data output buffer of a semiconductor memory device. The method comprises:

transmitting the single data signal in response to a first state of a bypass control signal associated with the single data signal;

latching the transmitted data signal for preventing data transition; and transmitting the latched data signal in response to a second state of the bypass control signal.

The semiconductor memory device of the present invention thus constructed prevents data output errors and reduces the time interval of cycles in bypass operation.

BRIEF DESCRIPTION OF THE DRAWINGS

Objects and aspects of the invention will become apparent from the following description of an embodiment with reference to the accompanying drawings in which.

DETAILED DESCRIPTION OF THE PRESENT INVENTION

Objects and aspects of the present invention will become apparent from the following detailed description of a preferred embodiment with reference to the accompanying drawings. It should be noted that the similar or same parts in the drawings are designated with the similar or same reference numerals for convenient descriptions and understandings.

Figure 1A:
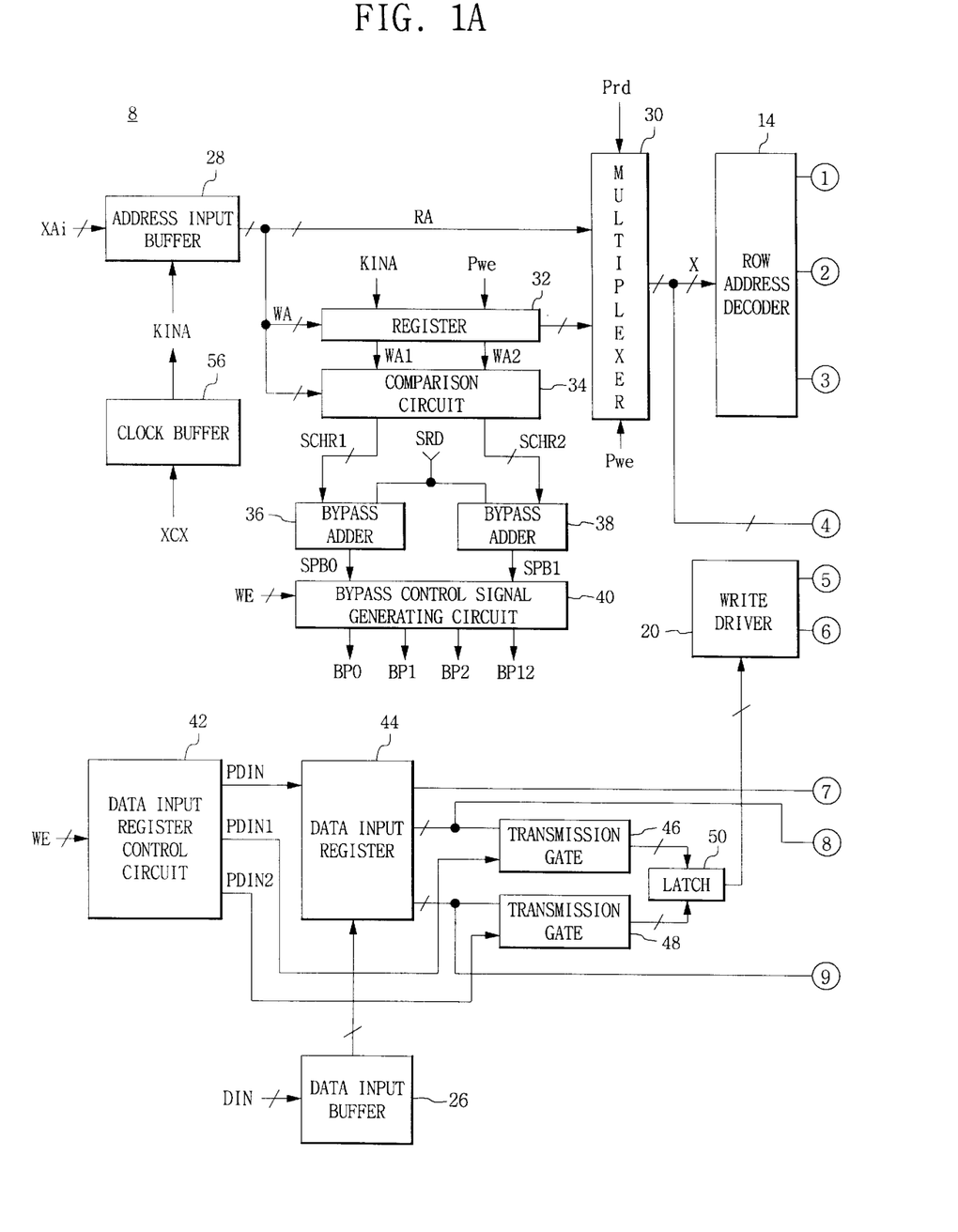
FIGS. 1A and 1B, when combined along their common circled numerals 1–9, form a schematic block diagram of a semiconductor device according to the present invention.
Figure 1B:
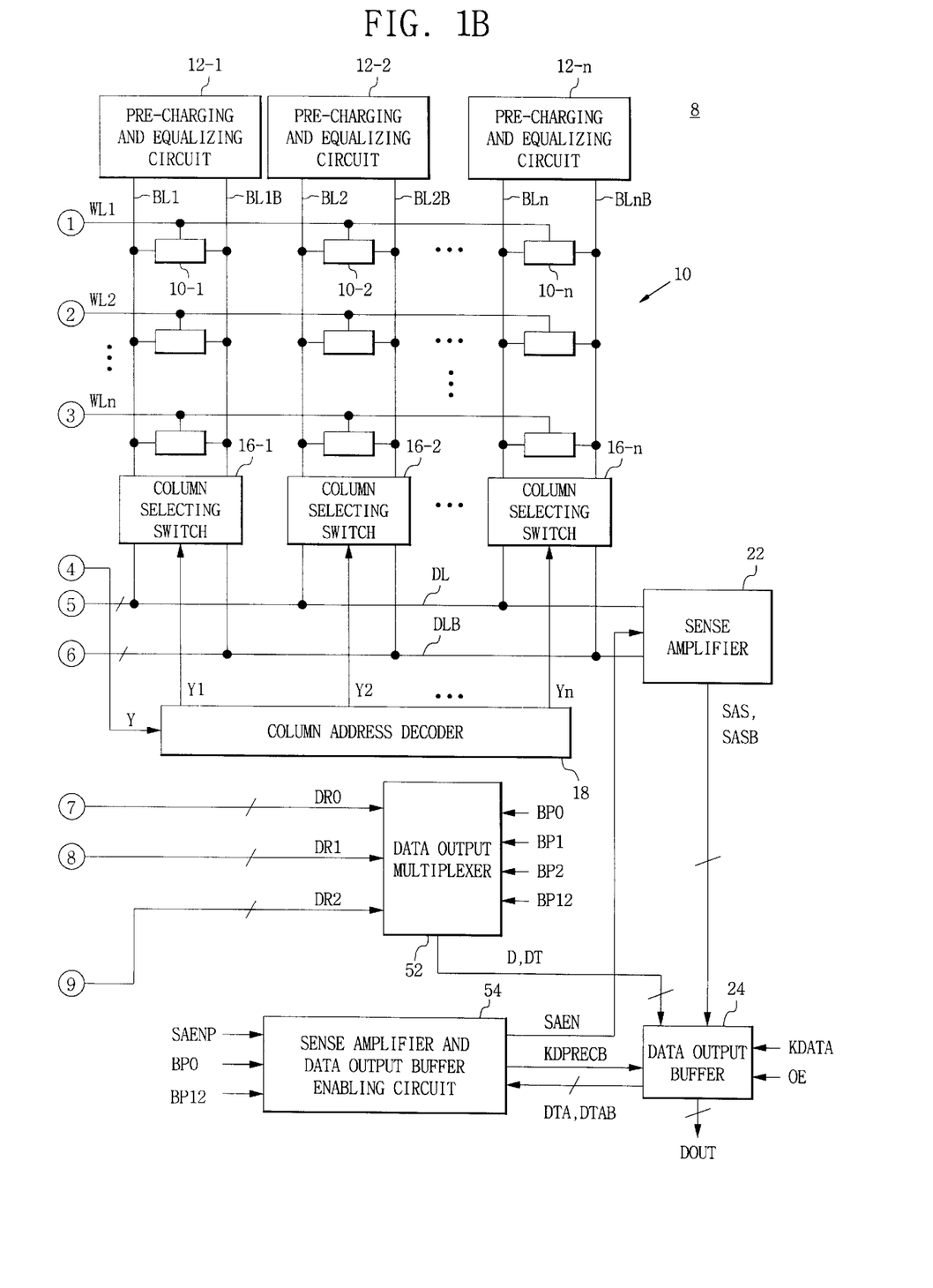

FIGS. 1A and 1B, combined form a schematic block diagram for illustrating a semiconductor memory device 8 according to the present invention. In the drawings, a late-write type semiconductor memory device having a function of bypass operation includes: memory cells 10-1, 10-2, . . . , 10-n for constructing a memory cell array 10; pre-charging, and equalizing circuits 12-1, 12-2, . . . , 12-n, row address decoder 14, column selecting switches 16-1, 16-2, . . . , 16-n, column address decoder 18, write driver 20, sense amplifier 22, data output buffer 24, data input buffer 26, address input buffer 28, multiplexer 30, register 32, comparison circuit 34, bypass adders 36, 38, bypass control signal generating circuit 40, data input register control circuit 42, data input register 44, transmission gates 46, 48, latch 50, data output multiplexer 52 and sense amplifier and data output buffer enabling circuit 54.

Functions and operations of respective parts of the semiconductor memory device will be described below. The memory cells 10-1, 10-2, . . . , 10-n for constructing the memory cell array 10 are selected in response to word line selecting signals WL1, WL2, . . . , WLn and column selecting signals Y1, Y2, . . . , Yn for writing data sent to pairs of bit lines BL1, BL1B, BL2, BL2B, . . . , BLn, BLNB into the memory cells or outputting data stored at the cells to the pairs of bit lines in read operation. The pre-charging and equalizing circuits 12-1, 12-2, . . . , 12-n pre-charge and equalize pairs of bit lines in the reading operation.

The row address decoder 14 generates word line selecting signals by decoding a row address X.

The column selecting switches 16-1, 16-2, . . . , 16-n control data transition between pairs of bit lines and pairs of data lines in response to the row selecting signals X. The column address decoder 18 decodes a column address Y to generate row selecting signals Y1, Y2 . . . , Yn.

The write driver 20 transits inputting write data to pairs of data lines DL, DLB. The sense amplifier 22 mainly amplifies and outputs the data transited to the pairs of data output lines DL, DLB. The data output buffer 24 buffers the sense-amplified or bypassed data to output as output data DOUT.

The data input buffer 26 buffers the data DIN input from outside through an input and output pin.

The clock buffer 56 generates an internal clock signal by synchronizing with an external clock signal XCK. The address input buffer 28 buffers the address XAi input from outside in response to a signal KINA, and outputs an output read address RA and a write address WA.

The register 32 latches an output signal of the address input buffer 28 in response to signals KINA, Pwe, and delays for one cycle to generate a signal WA1, and delays for one more cycle to generate a signal WA2. In other words, the signal WA1 is a one cycle pipelined signal in response to signals KINA, Pwe. The signal WA2 is a two cycle pipelined signal in response to a signal Pwe. Furthermore, the signal Pwe is generated by a write enable signal and clock signal in write operation. Thus, the signal WA1 is output to the multiplexer 30 in the one cycle late-write operation, and the signal WA2 is output to the multiplexer 30 in the two cycle late-write operation.

The multiplexer 30 multiplexes read address RA or write address WA in response to signals Prd or Pwe to thereby output row address X and column address Y. The signal Prd can be generated by a read enable signal and a clock signal in reading operation.

The comparison circuit 34 respectively generates a signal SCHR1 if signal WA1 and read address RA are compared to be identical, and a signal SCHR2 if signal WA2 and read address RA are compared to be identical.

The bypass adder 38 generates a signal SBP1 by adding the read signal SRD and the signal SCR2.

The bypass control signal generating circuit 40 generates bypass control signals BP0, BP1, BP2, BP12 in response to the write enable signal WE to thereby generate a bypass 1 signal BP 1 in one cycle late-write operation and the other bypass signals in the corresponding number of cycle late-write operations. In other words, bypass control signal BP0 is generated in a bypass 0 operation. Bypass control signals BP1, BP12 are generated in a bypass 1 operation. Bypass control signals BP2, BP12 are generated in a bypass 2 operation.

The data input register control circuit 42 generates control signals PDIN, PDIN1, PDIN2 by inputting a write enable signal WE. In order to perform the one cycle late-write operation, the data input register control circuit 42 generates a signal PDIN by synchronizing with the clock signal after write one cycle. If there is a read command after the one write one cycle, the data input register control circuit 42 generates a signal PDIN1. Furthermore, in order to perform the two cycle late-write operation, the data input register control circuit 42 generates a signal PDIN by synchronizing with the clock signal after write two cycle. If there is a read command after write one cycle or before write two cycle, the data input register control circuit 42 generates a signal PDIN1. If there is a write command after write one cycle or before write two cycle, the data input register control circuit 42 generates a signal PDIN2.

The data input register 44 transmits and latches a data input signal DIN in response to the signal PDIN to output signals DR0, DR1, DR2 to the data output multiplexer 52. The transmission gate 46 transmits a signal DR1 in response to the signal PDIN1. The transmission gate 48 transmits a signal DR2 in response to the signal PDIN2. The latch 50 latches and outputs the output signals of the transmission gates 46, 48 to write driver 20.

In response to the bypass control signals BP0, BP1, BP2, BP12, the data output multiplexer 52 selects one of the signals DR0, DR1, DR2 as bypass data to output to the data output buffer 24.

In FIGS. 1A and 1B, register 32, comparison circuit 34, bypass adders 36, 38, bypass control signal generating circuit 40 are used for constructing a circuit to generate bypass control signals. The data input register control circuit 42, data input register 44, transmission gates 46, 48 and data output multiplexer 52 are directly used for performing the bypass operation.

Figure 2:
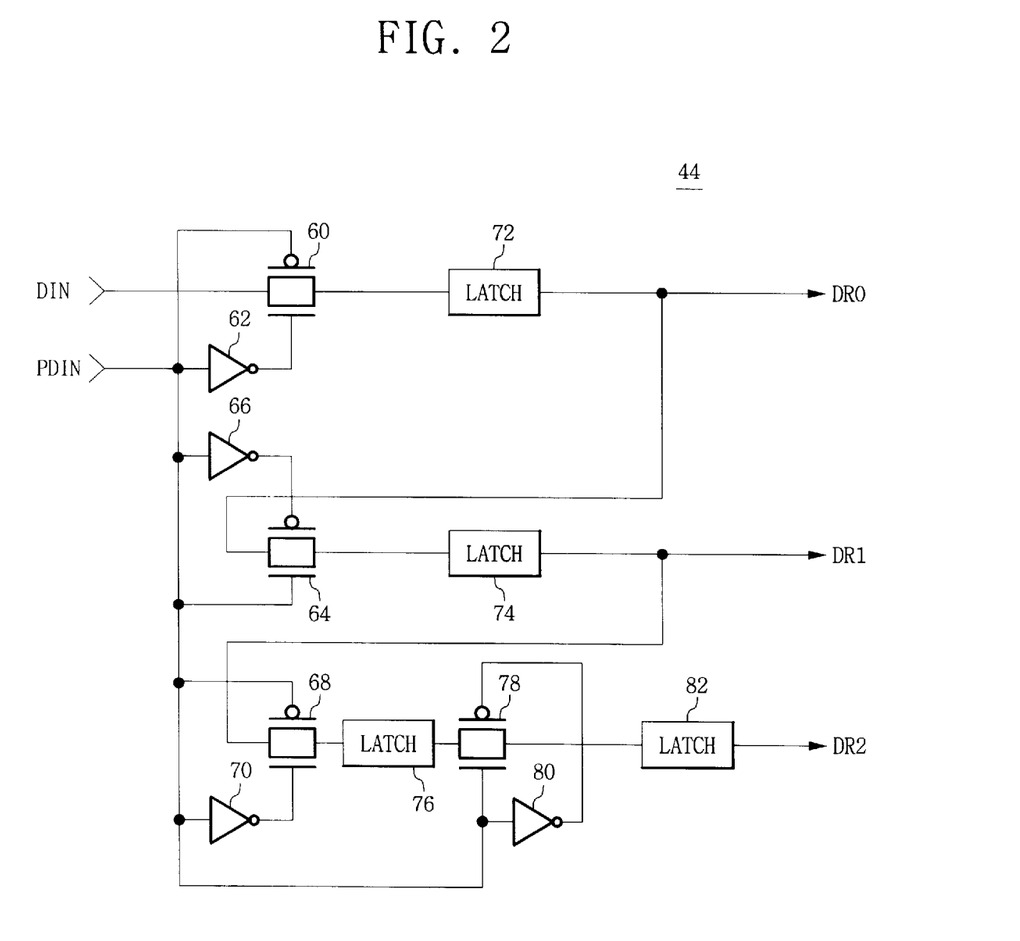
FIG. 2 is a perspective circuit diagram for illustrating the data input register shown in the device of FIGS. 1A and 1B.

FIG. 2 is a perspective circuit diagram for illustrating an embodiment of the data input register 44 shown in FIGS. 1A and 1B. Register 64 includes inverters 62, 66, 70, 80, transmission gates 60, 64, 68, 78 and latches 72, 74, 76, 82.

The transmission gates 60, 68 respectively transmit data input signals DIN and DR1 in response to a low level signal PDIN. The latches 72, 76 respectively latch signals transmitted through the transmission gates 60, 68. The transmission gates 64, 78 respectively transmit a signal DR0 and the signals latched at the latch 76 in response to a high level signal PDIN. The latches 74, 82 respectively latch signals transmitted through the transmission gates 64, 78. Signals DR1 and DR2 are the signals respectively output through latches 74, 82.

Therefore, in a low level interval of the signal PDIN of the circuit shown in FIG. 2, data input signal DIN and the data stored at the latch 74 are respectively transmitted to the transmission gates 60, 68. In a high level interval of the signal PDIN of the circuit shown in FIG. 2, the data stored at the latches 72, 76 are respectively transmitted as signals DR1, DR2.

In other words, the circuit shown in FIG. 2 outputs one of signals DR0, DR1, DR2 to the data output multiplexer 52 in performing bypass 0, bypass 1 and bypass 2 functions. The bypass 0 function is for the case that a write command is followed by a read command of the same address. The bypass 1 function is for the case that write, read and read commands advance in sequence, wherein the write address and the last read address are identical. The bypass 2 function is for the case that write, write and read commands advance in sequence, wherein the first write address and the read address are identical.

On the other hand, the device of FIGS. 1A and 1B, the transmission gate 46 transmits the signal DR1 in response to the signal PDIN1, and the transmission gate 48 transmits the signal DR2 in response to the signal PDIN2. Furthermore, the latch 50 latches the output signal of transmission gates 46, 48 to output to the write driver 20.

In other words, the transmission gates 46, 48 and the latch 50, to which output signals DR1, DR2 of the data input register 44 are input, are constructed for providing the circuit for the one or two cycle late-write operation.

Figure 3:
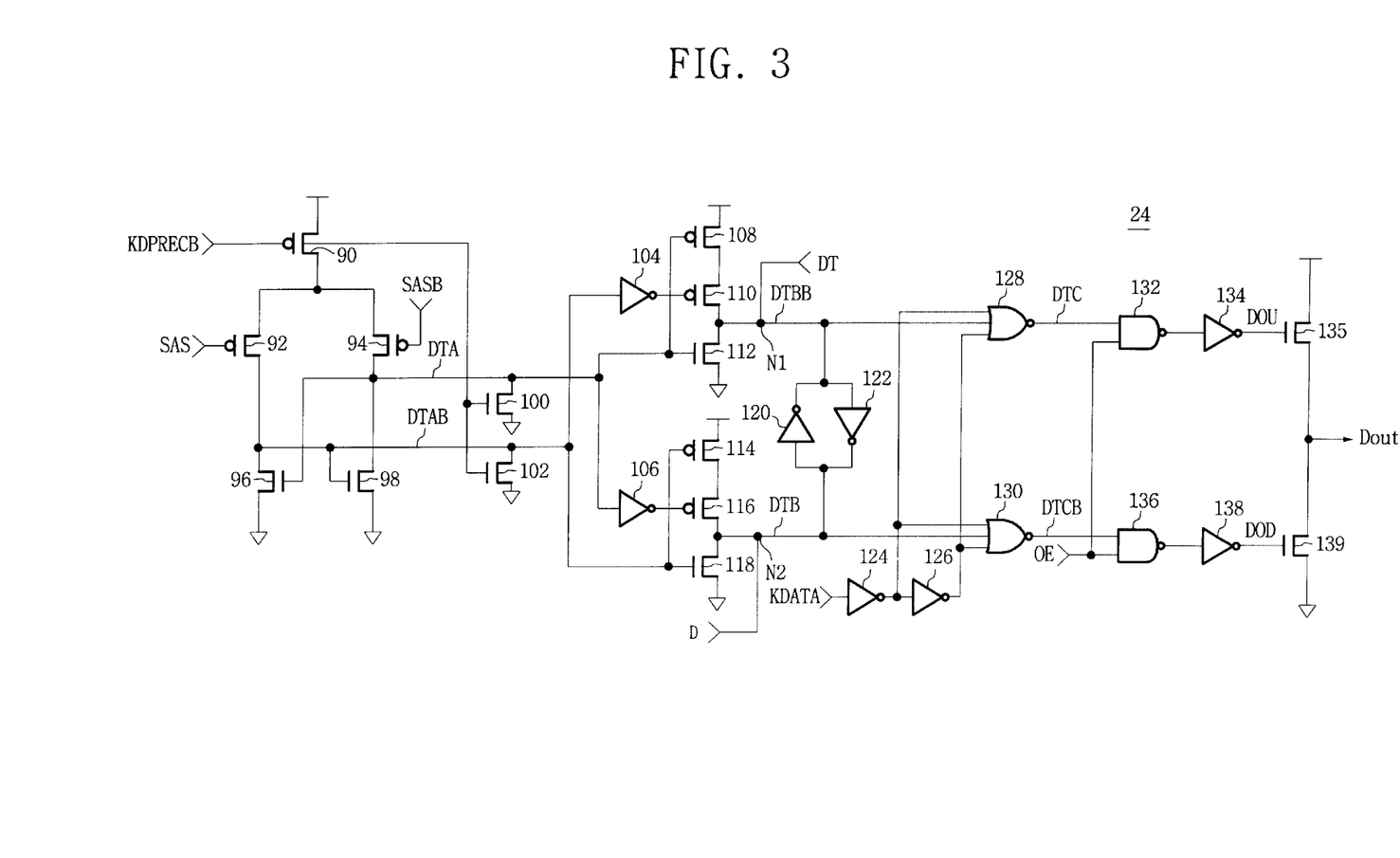
FIG. 3 is a circuit diagram of the data output buffer shown in the device of FIGS. 1A and 1B.

FIG. 3 is a perspective circuit diagram for illustrating an embodiment of the data output buffer 24 shown in FIGS. 1A and 1B. Buffer 24 includes PMOS transistors 90, 92, 94, 108, 110, 114, 116, NMOS transistors 96, 98, 100, 102, 112, 118, inverters 104, 106, 120, 122, 124, 126, 134, 138, NOR gates 128, 130, NAND gates 132, 136 and NMOS transistors 140, 142 to be output drivers. In the enable circuit made up of PMOS transistor 90 and NMOS transistors 92, 94, 96, 98, 100, 102, if the enable signal is at its high level for perfoming the write operation the PMOS transistor 90 turns off and the NMOS transistors 100, 102 turn on, to switch and keep a pair of data lines DTA, DTAB at their low level. If the enable signal is at its low level for perfoming the read operation, the PMOS transistor 90 turns on and the NMOS transistors 100, 102 turn off, to thereby transmit the output signals SAS, SASB of the sense amplifier 22 shown in FIGS. 1A and 1B to the pair of data lines DTA, DTAB.

In the circuit made up of inverters 104, 106, PMOS transistors 118, 110, 114, 116, NMOS transistors 112, 118 and latches 120, 122, if all the data of the pair of data lines DTA, DTAB are at their low level for performing the write operation, all of the PMOS transistors 110, 116 and NMOS transistors 112, 118 turn off to thereby keep the data being, latched to the latches 120, 122 at a pair of data lines DTBB, DTB. For the read operation, the data transited to the pair of data lines DTA, DTAB are respectively inverted to further transit to the pair of data lines DTAA, DTB. The circuit made up of inverters 124, 126, and NOR gates 128, 130 inverts the data transited to the pair of data lines DTBB, DTB by the signal KDATA synchronized with the clock signal XCK to output to a pair of data lines DTC, DTCB.

In other words, when the signal KDATA is shifted from its low level to its high level, the aforementioned circuit inverts the data transited to the pair of data lines DTBB, DTB to further transit to the pair of data lines DTC, DTCB. The circuit made up of NAND gates 132, 136 and inverters 134, 138 outputs the signals transmitted to the pair of data lines DTC, DTCB as data output signals DOU, DOD in response to an output enable signal OE.

The NMOS transistors 135, 139 used as output drivers finally output a high or low level of output data DOUT through the input/output pin to outside in response to the data output signals DOU, DOD applied to the gate terminal. The data output buffer shown in FIG. 3 performs a normal data output operation and it also has nodes N1, N2 for receiving the outputs of the data output multiplexer 52 to output data according to the one or two cycle late-write bypass operation.

Figure 4:
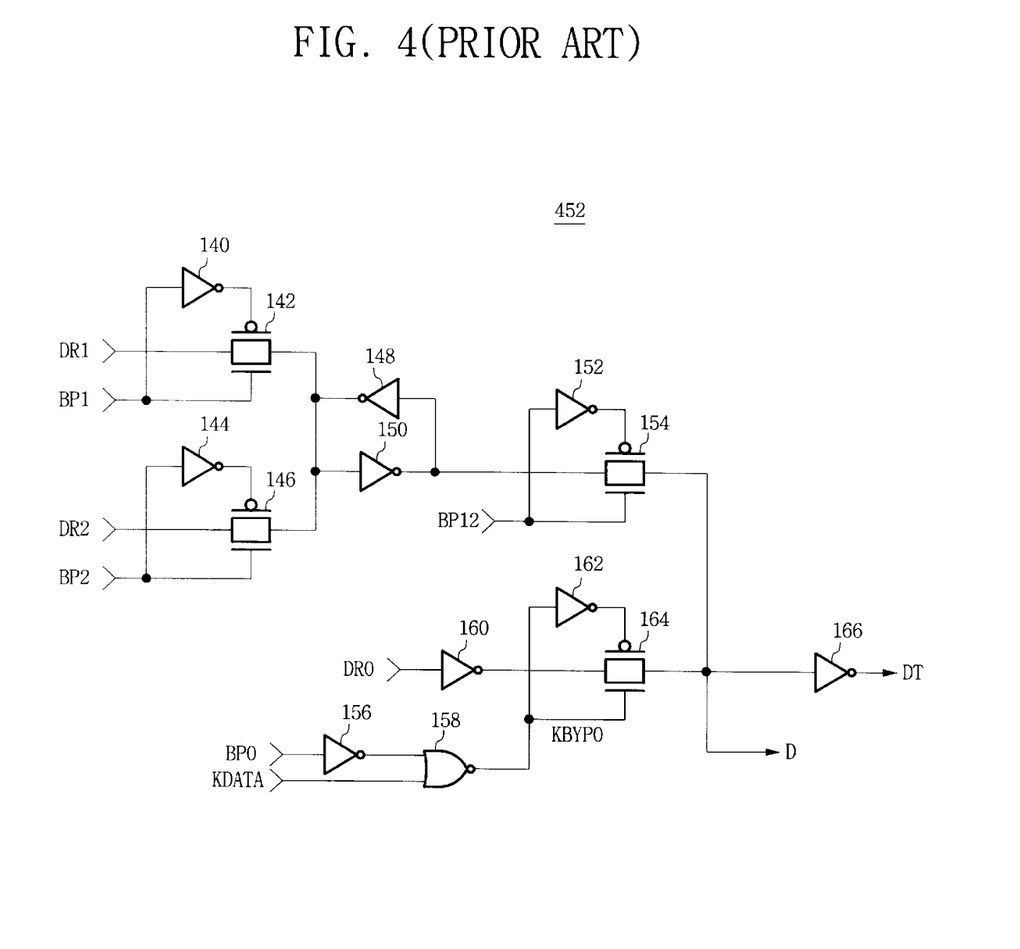
FIG. 4 is a circuit diagram of a data output multiplexer in the prior art, that is sometimes used in a device similar to that of FIGS. 1A and 1B.

FIG. 4 is a circuit diagram for illustrating a data output multiplexer 452, which is used in the prior art in place of data output multiplexer 52 in devices somewhat similar to device 8 of FIGS. 1A and 1B. Circuit 452 is not part of the invention. In order, however, to provide a thorough understanding of the present invention and appreciation of its advantages, there are described causes of data output errors that occur more frequently in the high speed operation than in the bypass operation of the semiconductor device. The invention, as will be seen later, operates better than devices in the prior art, because device 8 uses circuit 52, shown in FIG. 8.

Returning, to FIG. 4, multiplexer 452 includes inverters 140, 144, 148, 150, 152, 156, 160, 162, 166, transmission gates 142, 146, 154, 164 and NOR gate 158. The transmission gates 142, 146 respectively transmit signals DR1, DR2 in response to the bypass control signals BP1, BP2. The latches 148, 150 latch output signals of the transmission gates 142, 146. The transmission gate 154 transmits the output signal of the inverter 150 of a latch in response to the associated bypass control signal BP12. The inverter 156 inverts the bypass control signal BP0. The NOR gate 158 outputs a signal KBYPO by NORing an output signal of the inverter 156 and a signal KDATA.

In other words, the signal KBYPO is enabled at its high level if the bypass control signal BP0 is enabled and the signal KDATA is at its low level. The inverter 160 inverts the signal DR0. The transmission gate 164 transmits the output signal of the inverter 160 to a data line D in response to the signal KBYPO. The inverter 166 transmits the signal transmitted to the data line D to the inversion data line DT. In the bypass operation of the prior art, the signals transmitted to the data line D and the inversion data line DT are respectively applied to the nodes N2, N1 shown in FIG. 3 to thereby output as output data DOUT after being latched and gated.

Figure 5:
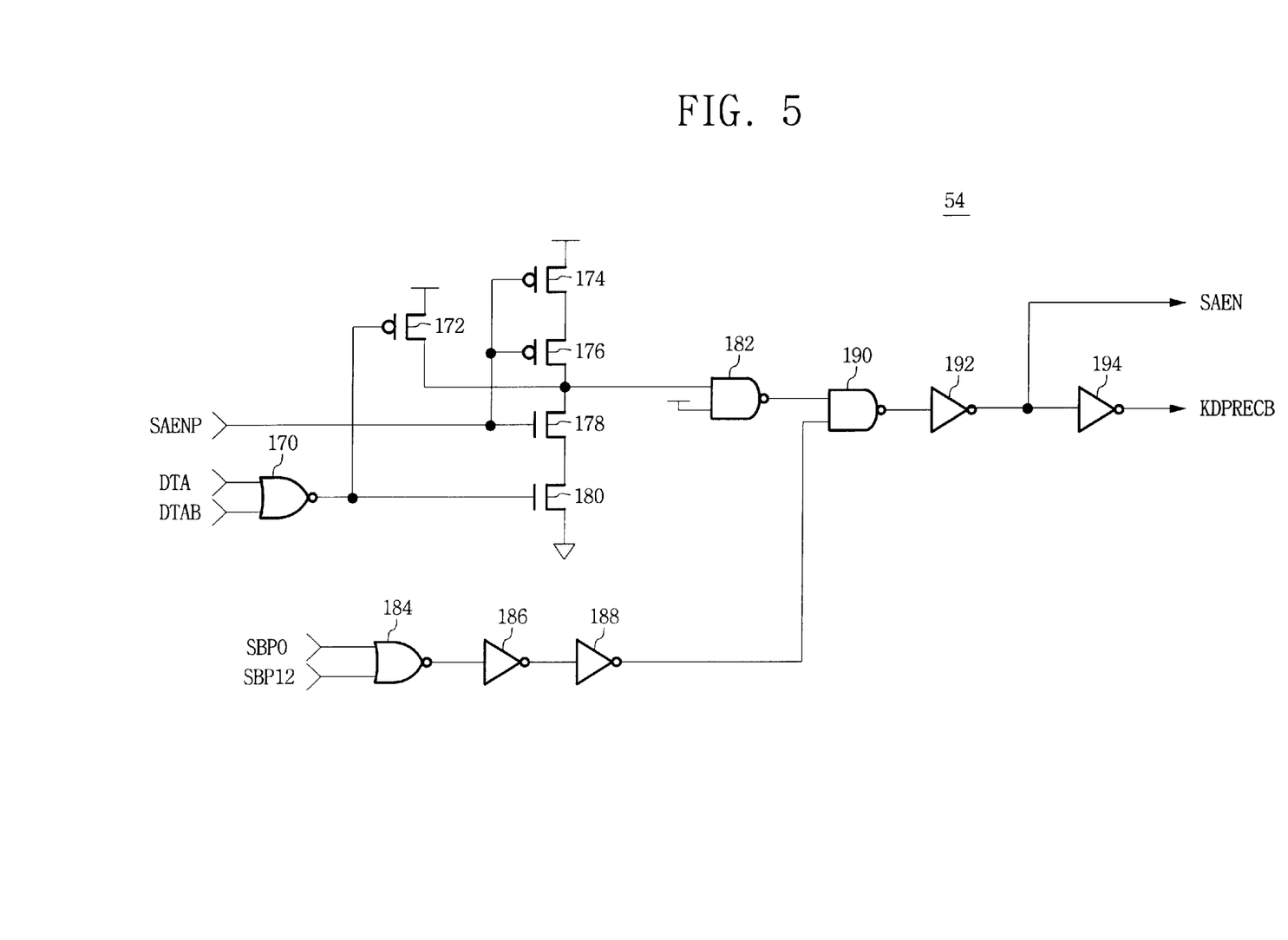
FIG. 5 is a perspective circuit diagram of the sense amplifier and data output buffer enable circuit shown in the device of FIGS. 1A and 1B.

FIG. 5 is a perspective circuit for illustrating an embodiment of the sense amplifier and data output buffer enable circuit 54 according to the invention. Circuit 54 is for generating the sense amplifier enable signal SAEN and data output buffer enable signal KDPRECB. The circuit 54 is constructed with NOR gates 170, 184, NAND gates 182, 190, PMOS transistors 172, 174, 176, NMOS transistors 178, 180 and inverters 186, 188, 192, 194. With a read command, an enable signal SAENP is generated for enabling the sense amplifier. The NOR gate 170 NANDs the signal generated from a pair of data lines DTA, DTAB.

In other words, when all the data of the pair of data lines DTA, DTFAB are at their low level, a high level signal is generated by the NOR gate 170. The NMOS transistors 178, 180 turn on in response to a high level of the enable signal SAENP and the output signal of the NOR gate 170, to thereby set the drain of the PMOS transistor 178 at its low level. At this time, an operation is performed for generating a signal to enable the sense amplifier and the data output buffer. The NAND gate 182 generates a high level signal by NANDing the low level signal and the high level signal. In response to the signals SBP0, SBP12, the NOR gate 184 and inverters 186, 188 generate a high level signal it both of the signals SBP0, SBP12 are at their low level and a low level signal if either of the two signals SBP0, SBP12 is at its high level.

In other words, circuit 54 is used for disabling operations of the sense amplifier and the data output buffer in the bypass operations. The NAND gate 190 and inverter 192 perform a NAND operation on the output signals of the NAND gate 182 and the inverter 188. If the aforementioned signals are at their high level, the NAND gate 190 and inverter 192 generate a high level of a sense amplifier enable signal SAEN and a low level of a data output buffer enable signal KDPRECB, thereby enabling the operations of the sense amplifier 22 and the data output buffer 24. Furthermore, if the output signal of the inverter 188 is shifted to its low level for the bypass operation, the NAND gate 190 generates a low level of the sense amplifier enable signal SAEN and a high level of the data output buffer enable signal KDPRECB, thereby disabling the sense amplifier 22.

Figure 6:
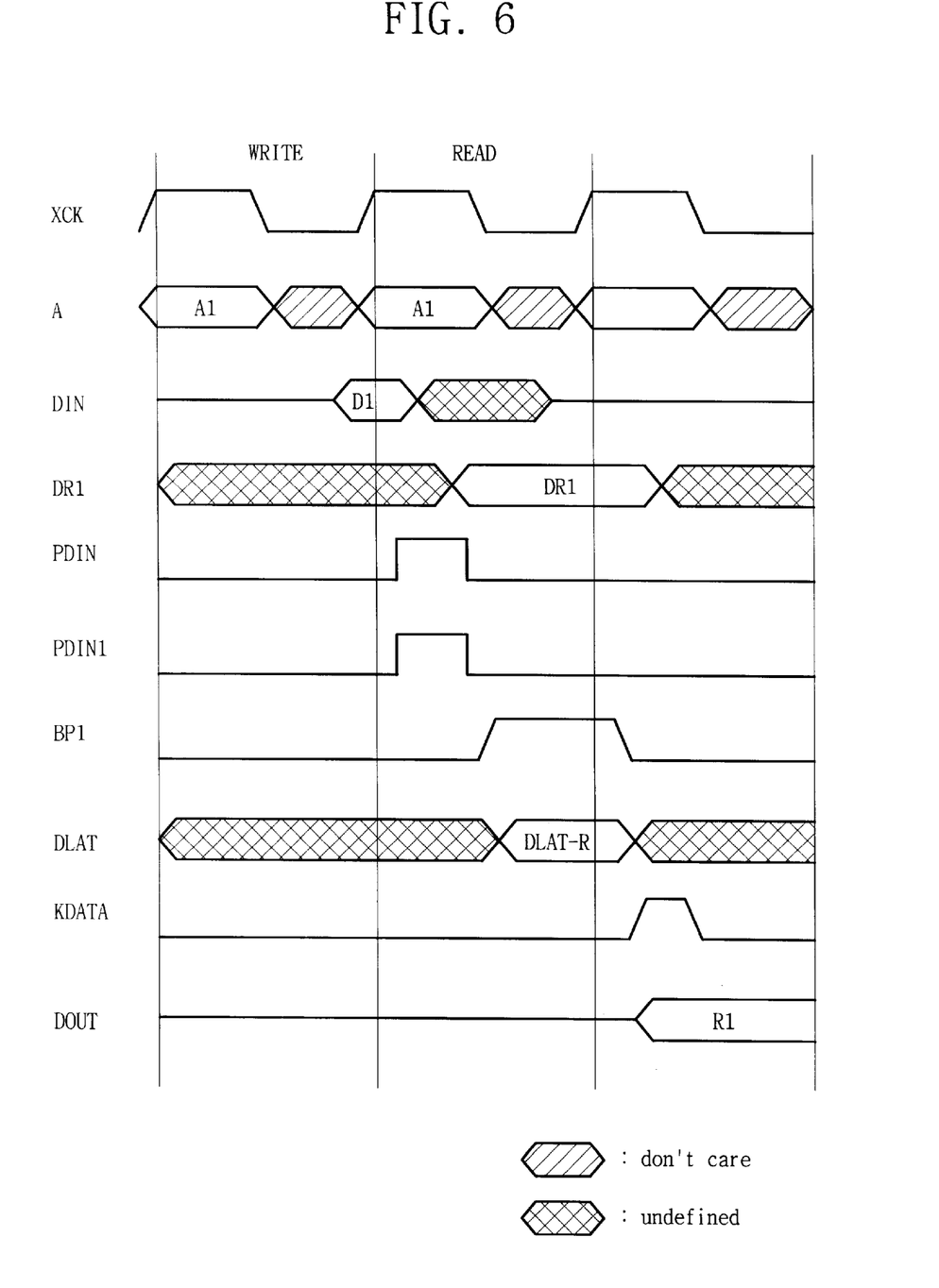
FIG. 6 is an operation timing diagram for illustrating a one cycle late-write bypass operation, when the prior art circuit of FIG. 4 is used as a data output multiplexer in a device similar to that of FIGS. 1A and 1B.

FIG. 6 is an operation timing diagram for illustrating one cycle late-write bypass operation of the devices shown in FIGS. 1A and 1B, and using the prior art circuit of FIG. 4. The one cycle late-write bypass operation is performed if a read command is followed by a write command, wherein the read address is the same as the write address one cycle earlier. The operation of the sense amplifier 22 is disabled in the bypass operation. At the first cycle, if a write command is input, the address input buffer 28 buffers and outputs the write address A1. The register 32 latches the write address A1. At the second cycle, when a read command is input, the address input buffer 28 buffers and outputs the read address A1.

The comparison circuit 34 generates a signal SCHR1 when the write address and the read address are identical. The bypass adder 36 adds the signal SCHR1 in response to the signal SRD to generate a bypass signal SBP0. The bypass control signal generating circuit 40 inputs the bypass signal SBP0 to generate bypass 1 signals BP1, BP112 in the one cycle late-write operation. The data input buffer 26 outputs the data input signal DIN input from the first cycle of the low level interval to the data input register 44. The data input register 44 generates a signal DR1 in response to the signal PDIN. The data output multiplexer 452 outputs the signal DR1 to the latch of the data output buffer 24 in response to the bypass 1 signals BP1, BP12. The data output buffer 24 receives the signals latched at the latch via nodes N1, N2 to output as the output data DOUT in response to control signals KDATA, OE.

As described above, a bypass operation is performed. In other words, if a read command is followed by a write command, and a read address identical with a write address are input in the one cycle late-write bypass operation, the bypass control signal generating circuit 40 generates a bypass 1 signal. The signal PDIN is enabled by synchronizing with the clock signal after one cycle later than the write operation. The signal PDIN1 is enabled if a read command is followed by the write one cycle.

Furthermore, in case the one cycle late-write operation, the register 32 delays the output signal of the address input buffer 28 for one cycle to output to the multiplexer 30. The data input register 44 outputs the data input signal DIN, which is delayed by one cycle and input from the data input buffer 26, as a signal DR1 in response to the signal PDIN. The transmission gate 46 latches the signal DR1 to the latch 50 in response to the signal PDIN1. The latch 50 outputs the latched signal to the write driver 20. As described above, the one cycle late-write command is processed.

Figure 7:
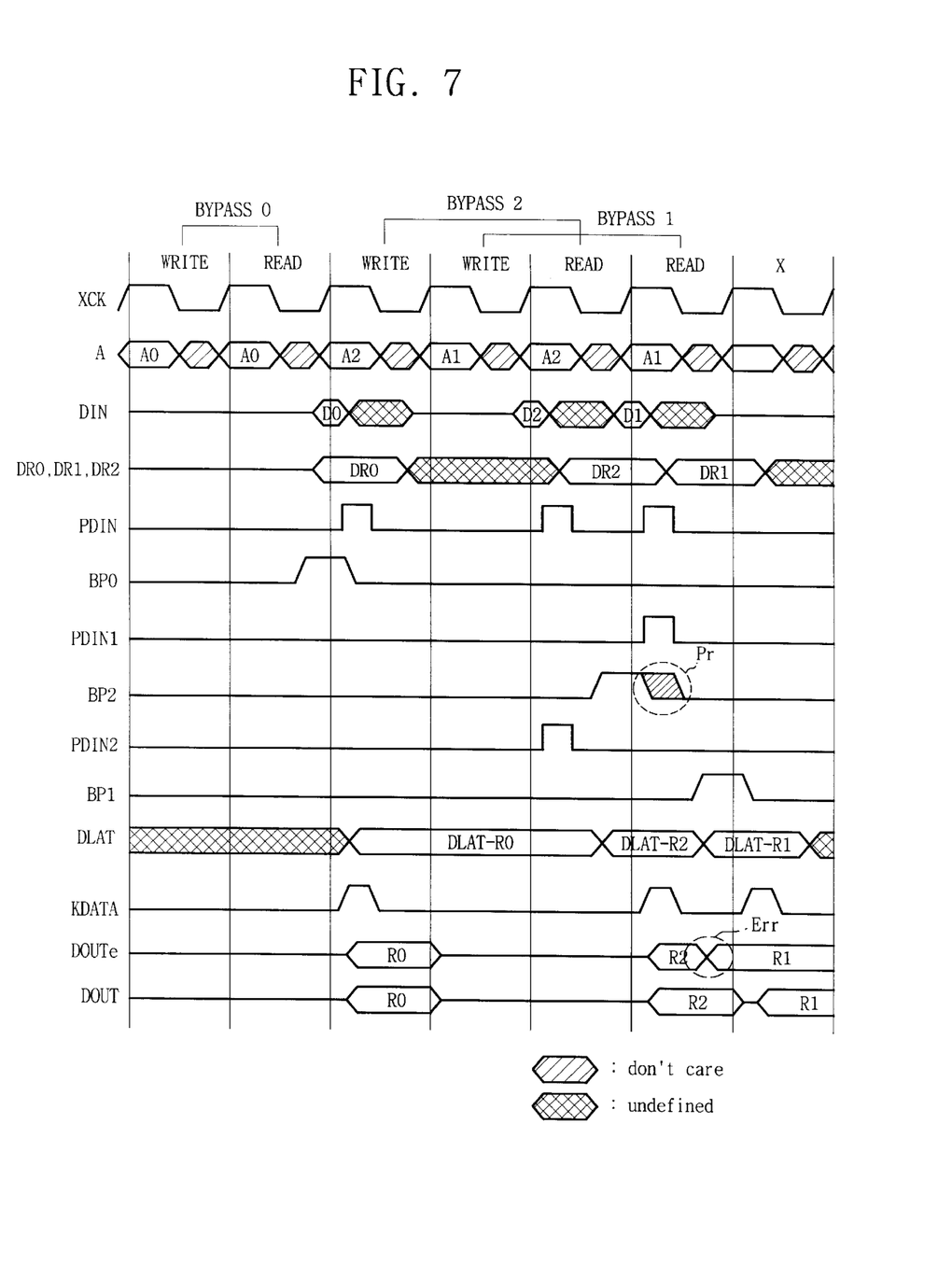
FIG. 7 is an operation timing diagram for illustrating problems in a two cycle late-write bypass operation and high speed operation, when the prior art circuit of FIG. 4 is used as a data output multiplexer in a device similar to that of FIGS. 1A and 1B.

FIG. 7 is an operation timing diagram for illustrating the two cycle late-write bypass operation and indicating problems in high speed operation of the device shown in FIGS. 1A and 1B, if it uses the prior art circuit 452 of FIG. 4. As shown in the timing process of the data input signal shown in FIG. 7, the two cycle late-write bypass operation is performed if the read address is identical with the write address one cycle earlier, or if the read address is identical with the write address two cycles earlier.

In the process of the bypass operation, the sense amplifier 22 is disabled. First of all, the bypass 0 operation will be described below. If a write command is input at the first cycle, a write address A0 is input to the address input buffer 28 in response to a high level of the clock signal XCK. The address input buffer 28 outputs the buffered write address A0 to the register 32, which latches the output signal of the address buffer 28 in response to a signal Pwe to generate a signal WA1. At the second cycle, if a read command is input, a read address A0 identical to the write address is input in response to a high level of the clock signal XCK. Then, the comparison circuit 34 compares the output signal WA1 of the register 32 and the inputted read address A0 and determines that both are the same, to thereby generate a signal SCHR1. The signal SCHR1 is generated for performing the bypass operation. The bypass adder 36 generates a high level of a signal SBP0 by adding the signal SCHR1 with the read signal SRD if a read command is followed. The bypass control signal 1generating circuit 40 generates a bypass 0 signal BP0 by inputting the signal SBP0. At this time, the data input signal is not transmitted to the write driver 20, but outputted through the data output multiplexer 452 and the data output buffer 24. For the aforementioned process, the data input signal DIN is output as a signal DR0 in response to a low level of the control signal PDIN after the write two cycle. The signal DR0 is outputted to the data output multiplexer 452, which transmits the signal DR0 through the transmission gate 164 shown in FIG. 4 to the latches 120, 122 shown in FIG. 3 in response to the bypass 0 signal BP0 and the signal KDATA. At last, the signal DR0 is designated as a signal DLAT-R0. The data transmitted to the latches generates an output signal R0 in response to the signal KDATA and the output enable signal OE.

Next, the bypass 1 operation is described. If a write command is input at the fourth cycle, a write address A1 is input to the address input buffer 28 in response to a high level of the clock signal XCK. The address input buffer 28 outputs the buffered write address A1 to the register 32, which latches an output signal of the address input buffer 28 in response to the signal Pwe to generate a signal WA1. Thus, if a read command is followed at the fifth cycle, a read address A2 is input in response to a high level of a clock signal XCK. Then, the comparison circuit 34 compares the address A0, that is, the output signal WA1 of the register 32 and the inputted read address A2, wherein both of the signals are not identical to thereby make it impossible to generate a signal SCHR1. If a read command is followed at the sixth cycle, a read address A1 is input in response to a high level of the clock signal XCK, and the data D1 of the write address A1 is input at the same time. The comparison circuit 34 generates a signal SCHR1 if the address A1, that is, the output signal WA1 of the register 32 and the read address A1 are identical. The bypass adder 36 generates a signal SBP0 in response to a signal SRD. In other words, the bypass adder 36 generates a signal SBP0 as all the bits of the signal SCHR1 are the same. The bypass control signal generating circuit 40 generates bypass 1 signals BP1, BP12 if a control signal WC indicates the bypass 1 operation. The control signal WC is generated for differentiating bypass 0 and bypass 1 operations. If a write command is followed by a read command, the bypass control signal generating circuit 40 generates the bypass 0 signal BP0. If a read command is followed by another read command, the bypass control signal generating circuit 40 generates the bypass 1 signals BP1, BP12. The data input buffer 26 buffers the data D1 to output to the data input register 44 and to generate signals DR0, DR1, DR2 in response to a signal PDIN. The data output multiplexer 452 transmits the signal DR1 to latch to the latches 120, 122 of the data output buffer 24 shown in FIG, 3. The data output buffer 24 generates a data output signal R1 in response to signals KDATA, OE.

Next, bypass 2 operation is described. If a write command is input at the third cycle, a write address A2 is input to the address input buffer 28 in response to a high level of the clock signal XCK. The address input buffer 28 outputs the buffered write address A2 to the register 32, which latches an output signal of the address input buffer 28 in response to the signal Pwe. Thus, if a write command is followed at the fourth cycle, a write address A1 is input in response to a high level of a clock signal XCK. Then, the comparison circuit 34 latches an output signal of the address input buffer 28 in response to an address Pwe. At a low level of this cycle, the data D2 of the write address A2 is input to the data input buffer 26. If a read command is followed at the fifth cycle, a read address A1 is input in response to a high level of the clock signal XCK. Then, the register 32 generates write addresses A1, A2 as output signals in response to a signal Pwve. The comparison circuit 34 compares signals WA1, WA2 and the read address A2. If they are the same as the signal WA2, the comparison circuit 34 generates a signal SCHR2. The bypass adder 38 generates a signal SBP1 in response to the signal SRD. The bypass control signal generating circuit 40 generates bypass 2 signals BP2, BP12 by inputting the signal SBP1. The data input register 44 generates signals DR0, DR1, DR2 by inputting the write data D2 from the data input buffer 26. The data output multiplexer 452 latches the signal DR2 to the data Output buffer 24 in response to the bypass 2 control signals BP2, BP12. The data output buffer 24 generates the data output signal R2 in response to signals KDATA, OE. In other words, in the two cycle late-write bypass operation, the bypass control signal generating circuit 40 generates a signal BP0 for the bypass 0 operation, signals BP1, BP12 for the bypass 1 operation, and signals BP2, BP12 for the bypass 2 operation. The bypass 12 control signal BP12 is simultaneously generated along with the bypass 1 control signal BP1 or the bypass 2 control signal BP2. Furthermore, in the 2 cycle late-write operation, the register 32 delays the output signal of the address input buffer 28 for two cycles to output to the multiplexer 30, and the data input register 44 inputs the data input signal DIN delayed by two cycles in response to the signal PDIN to generate signals DR0, DR1, DR2. The transmission gate 48 latches the signal DR2 to the latch 50 in response to the signal PDIN2. Then, the latch 50 outputs the latched signal to the write driver 20. As described above, the two cycle late-write operation has been performed.

However, as the semiconductor memory device for performing the aforementioned operations increases in its operation speed to approximately over 150 MHz, the time interval of cycles in the bypass operations reduces to proportionally decrease the margin of data hold time. Accordingly, there can be data output errors in the bypass operation of the memory device, not performing its high speed operation. It may be necessary to refer to FIG. 7 in specifically identifying the aforementioned problems. As the time interval of cycles reduces in the high speed operation of the device, the third high pulse interval of the wave form PDIN and the high pulse interval of the wave form BP2 may overlap as shown in FIG. 7. If the interval Pr designated in the high pulse interval of the wave form BP2 increases, the bypass output data R1 can be output like an error Err shown in the wave form DOUTe in outputting the bypass output data R2. In other words, before the bypass 2 operation is completed, data can be transited, causing an bypass output error.

Figure 8:
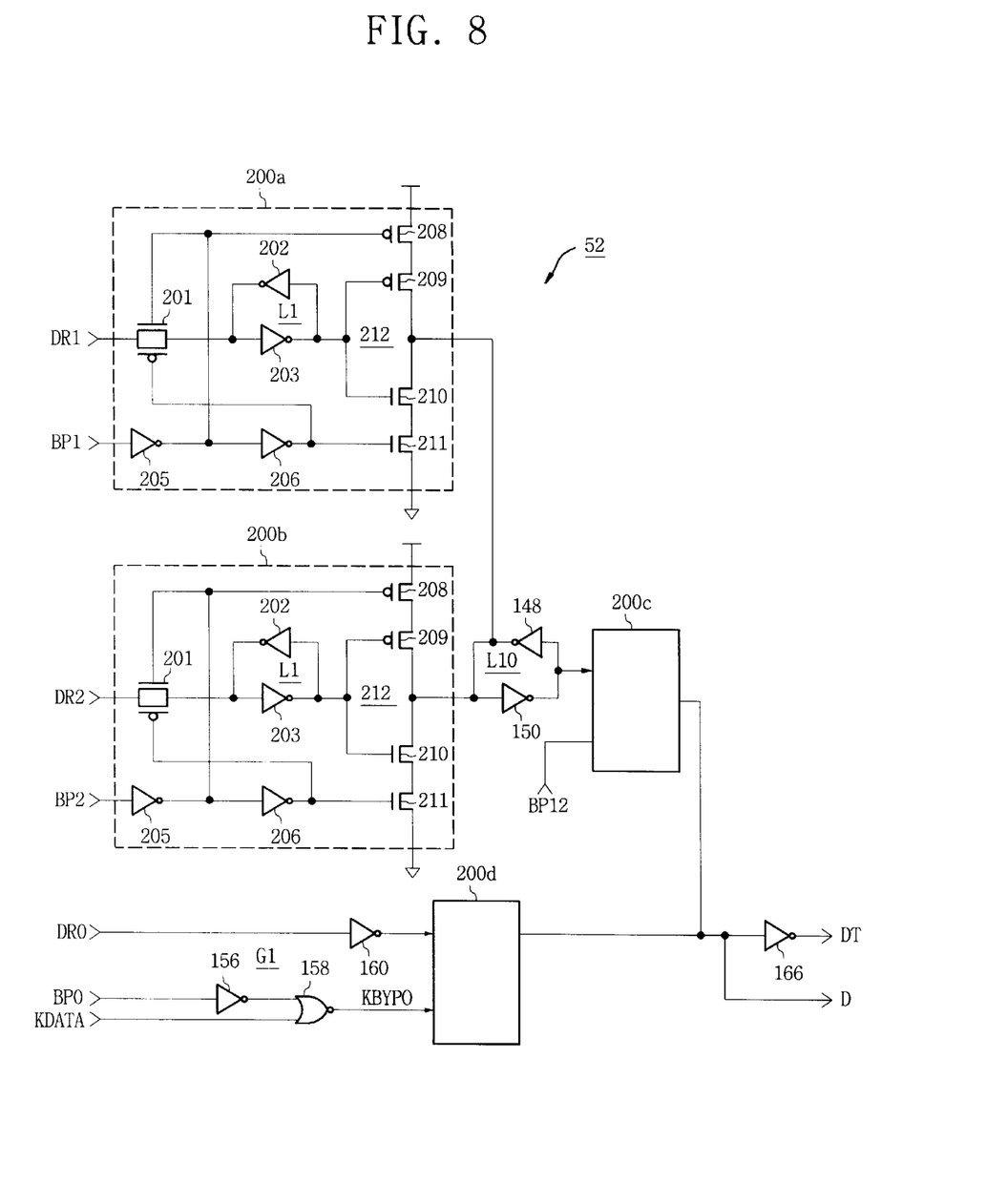
FIG. 8 is a circuit diagram of a data output multiplexer for the device of FIGS. 1A and 1B in accordance with an embodiment of the present invention.

These problems are absent, however, when circuit 52 of FIG. 8 according to the invention is used in device 8 of the invention, shown in FIGS. 1A and 1B. As a result, the two cycle late-write bypass operation can be more effectively performed at high speed.

Referring to FIG. 8, the preferred embodiment of the multiplexer circuit 52 for outputting bypass data is constructed with first, second, third and fourth data channels 200a, 200b, 200c, 200d respectively, each for channeling single, individual data signals prior to outputting them to the data output buffer 24.

The data channels 200a, 200b, 200c, 200d can be identical to each other, as is the preferred embodiment. Indeed, data channels 200c and 200d are only shown as blocks. Each can have a first switch 201 of CMOS transmission gate, a latch part L1 made from inverters, and a second switch 212 of a clocked CMOS inverter. The first switch 201 transmits to the latch part L1 the data applied in response to the first state of a corresponding, associated bypass control signal. For the embodiment of FIG. 8, the first state is the low logic level, e.g. 0. The latch part L1 latches the data output through the first switch 201. The second switch 212 transmits the latched data, output from the latch part L1, in response to the second state of the corresponding bypass control signal. In this embodiment, the second state is the high logic level, e.g. 1.

In addition, the data channels 200a, 200b, 200c, 200d can be interconnected as follows. A latch L10 latches the output of the first or second data channel, for inputting to the third data channel. A gating part G1 that includes an inverter 156 and a NOR gate 158, outputs a resultant signal KBYPO by NORing the signal inverted with the bypass 0 control signal BP0 and the clock control signal KDATA. The signal KBYPO is used to control the first signal DR0 as it is channeled through the fourth data channel 200d. An outputting inverter 166 is used for inverting the output D of the third or fourth data channel, to be output as DT. Signals D and DT are output from the multiplexer 52 to data output buffer 24.

The data channel thus constructed is advantageous in essentially preventing the data transition before completion of the bypass 2 operation. In other words, even if the third high pulse interval of the wave form PDIN and the high pulse interval of the wave form BP2 shown in FIG. 7 may overlap, the first switch 201 turns off, which prevents the data transition. In consequence, there will be no output of the bypass output data R1 in outputting the bypass output data R2 as shown in the wave form DOUTe. This penits the invention to perform the high speed operation more effectively than in FIGS. 6 and 7.

Since the device of the invention incorporates many channels, it is called multi-channel. While it is preferred, however, there is no need to employ data channels for each of the data signals. Only one channel, for only one of the signals needs to be employed.

In other words, the switches operate in turns to latch data, thereby essentially preventing data transition within one cycle before completion of the bypass operation at high speed. As a result, the data outputting operations of the memory device at high, speed can be stabilized, by reducing the time interval of cycles.

A method according to the invention is for channeling a single one of a plurality of data signals, prior to selectively outputting one of the data signals to a data output buffer of a semiconductor memory device. The method includes transmitting the single data signal (for example, DR1) in response to a first state of a bypass control signal (for example, BP1). The method also includes latching the transmitted data signal, such as in a latch L1, for preventing data transition. The method additionally includes transmitting the latched data signal in response to a second state of the bypass control signal. The bypass control signal can be used so that the single data signal is bypassed by at least another one of the data signals. Additional methods of the invention are described elsewhere in this document.

While the invention has been described in terms of a single preferred embodiment, those skilled in the art will recognize that the invention can be practiced with modification within the spirit and scope of the appended claims. For instance, the first and second switches of the data channels can be changed to other semiconductor switching elements, and the latch part can also be replaced with flip-flop or other storing means.

There are advantages in the present invention thus described in that the data transition is prevented within one cycle in the bypass operation for improving data processing speed of the semiconductor memory device and the data outputting operations of the semiconductor memory device at high speed is stabilized to improve performance.

What is claimed is:

1. A multiplexer circuit for selectively outputting one of a plurality of received data signals to a data output buffer of a memory device, the circuit comprising a first data channel for channeling a single first one of the plurality of data signals prior to outputting to the data output buffer, wherein the data channel includes:
    a first switch for transmitting the first data signal in response to a first state of a first bypass control signal associated with the first data channel;
    a latch part for latching the data signal output through the first switch of the first data channel; and
    a second switch for transmitting the data signal output from the latch part of the first data channel in response to a second state of the first bypass control signal.

2. The circuit of claim 1, wherein the first switch includes a CMOS transmission gate.

3. The circuit of claim 1, wherein the second switch includes clocked CMOS inverters.

4. The circuit of claim 1, wherein the latch part includes cross-coupled inverters.

5. The circuit of claim 1, wherein the data channel additionally includes an inverter for inverting a phase of the bypass control signal.

6. The circuit of claim 1, wherein the first bypass control signal alternates between the first state and the second state.

7. The circuit of claim 1, further comprising:
    a second data channel for channeling a single second one of the remaining data signals for outputting to the data output buffer, wherein the second data channel includes:
    a first switch for transmitting the single data signal in response to a first state of a second bypass control signal associated with the second data channel;
    a latch part for latching the data signal output through the first switch of the second data channel; and
    a second switch for transmitting the data signal output from the latch part of the second data channel in response to a second state of the second bypass control signal.

8. The circuit of claim 7, wherein the second bypass control signal alternates between the first state and the second state.

9. A multiplexer circuit for selectively outputting first, second and third signals to be bypassed to a data output buffer comprising:
    a first data channel having first switch, latch part and second switch constructed in sequence for latching and transmitting the second signal in response to a bypass 1 control signal;
    a second data channel having first switch, latch part and second switch constructed in sequence for latching and transmitting the third signal in response to a bypass 2 control signal;
    a latch part for latching the output signal of one of the first and second data channels;
    a third data channel having first switch, latch part and second switch constructed in sequence for latching and transmitting the signal output from the latch to the data output buffer in response to a bypass 12 control signal;
    a gating part for outputting a resultant signal by NORing the signal inverted with bypass 0 control signal and clock control signal and inverting and outputting the first signal;
    a fourth data channel having first switch, latch part and second switch constructed in sequence for latching the inverted first signal and outputting to the data output buffer in response to the resultant signal NORed at the gating part; and
    an outputting inverter for inverting the output of the third and fourth data channels to further apply to the data output buffer.

10. The circuit of claim 9, wherein the first and second switches of the first and second data channels operate in turns.

11. The circuit of claim 9, wherein the first, second and third signals are received from a data input register which receives input data.

12. A semiconductor memory device comprising:
    a plurality of memory cells;
    a write driver for transmitting data to the memory cells;
    a sense amplifier for amplifying and outputting data received from the memory cells in response to a sense amplifier control signal;
    a data input buffer for buffering and outputting a data input signal;
    an address input buffer for inputting and outputting the address input signal;
    a data output buffer for buffering and outputting the data output from the sense amplifier in response to a data output buffer control signal;

a bypass control signal generating circuit for delaying and outputting the write address output from the address input buffer for two cycles in two cycle late-write operation and generating bypass 0, bypass 1, bypass 2 and bypass 12 control signals by comparing a read address input by a read command and the write address input one or two cycles earlier both of which are determined to be the same; and a bypass control circuit for generating the data input signal input from the data input buffer in the two cycle late-write operation as signal 1, 2 or 3 in response to the first control signal, outputting signal 2 or 3 to the write driver in response to the second or third control signal, latching and outputting signal 1 to the data output buffer in response to the bypass 0 control signal, latching and outputting signal 2 to the data output buffer in response to the bypass 1 and bypass 12 control signals and latching and outputting signal 3 to the data output buffer in response to the bypass 2 and bypass 12 control signals.

13. The device of claim 12, wherein the data output buffer comprises:

a data output buffer enable circuit for outputting the output signal of the sense amplifier as a pair of the first output data in response to a data output buffer control signal;

an inversion and latch circuit for inverting and latching the pair of the first output data output from the data output buffer enable means to output as a pair of the second output data; and a data output circuit for inverting the output signal of the inversion and latch means to generate a pair of final data output signals.

14. The device of claim 12, wherein the bypass control signal generating circuit comprises:

a write address storing circuit for delaying and outputting the write address input from the address input buffer for two cycles in the two cycle late-write operation;

a selective circuit for selectively outputting the read address generated from the address input buffer and the write address delayed by two cycles at the write address storing means;

a comparison circuit for generating first and second comparison signals if the read address input from the address input buffer and the write address delayed by two cycles at the write address storing circuit are compared and determined that both signals are the same; and a control signal generating circuit for generating bypass 0, bypass 1, bypass 2 and bypass 12 control signals by inputting first and second comparison signals in the two cycle late-write operation.

15. The device of claim 12, wherein the bypass control circuit comprises:

a control signal generating circuit for generating the first, second and third control signals in the two cycle late-write operation:

a data input storing circuit for generating first, second and third signals by transmitting the data input signal delayed by two cycles and input in response to the first control signal and latching the second signal in response to the second control signal and the third signal in response to the third control signal to thereby transmit to the write driver;

a data output selecting circuit for latching and outputting the first signal in response to the bypass 0 control signal, the second signal in response to the bypass 1 and bypass 12 control signals and the third signal in response to the bypass 2 and bypass 12 control signals; and a sense amplifier and data output buffer control signal generating circuit for generating a control signal to control the sense amplifier and the data output buffer.

16. The device of claim 15, wherein the sense amplifier and data output buffer control signal generating circuit comprises:

a first NOR part for NORing the signals outputted from a pair of the first output data of the data output buffer;

a sense amplifier enable part for transmitting a low level signal in response to the sense amplifier control signal and the output signal of the first NOR part and a high level signal in response to the output signal of the first NOR part or the sense amplifier control signal;

an inversion part for inverting the output signal of the sense amplifier enable means;

a second NOR part for NORing the bypass 0 and bypass 12 control signals;

a sense amplifier control signal generating part for generating the sense amplifier control signal by ANDing the output signals of the inversion part and the second NOR part;

a data output buffer control signal generating part for generating the data output buffer control signal by inverting the sense amplifier control signal.

17. A method for channeling a single one of a plurality of data signals prior to selectively outputting one of the data signals to a data output buffer of a semiconductor memory device, the method comprising:

receiving a bypass control signal having an alternating first state and second state associated with the single data signal;

transmitting the single data signal in response to the first state of the bypass control signal;

latching the transmitted data signal for preventing data transition; and transmitting the latched data signal in response to the second state of the bypass control signal.

18. The method of claim 17, further comprising using the bypass control signal so that the single data signal is bypassed by at least another one of the data signals.

* * * * *

UNITED STATES PATENT AND TRADEMARK OFFICE
CERTIFICATE OF CORRECTION

PATENT NO.    : 6,320,794 B1
DATED         : November 20, 2001
INVENTOR(S)   : Kang et al.

It is certified that error appears in the above-identified patent and that said Letters Patent is hereby corrected as shown below:

Column 3,
Line 37, "BLNB" should read -- BLnB --.
Line 48, "Y2...," should read -- Y2,..., --.

Column 7,
Line 50, "BP112" should read -- BP12 --.

Column 8,
Line 40, "signal l generating" should read -- signal generating --.

Column 9,
Line 42, "Pwve" should read -- Pwe --.

Column 11,
Line 3, "penits" should read -- permits --.
Line 14, "high, speed" should read -- high speed --.

Column 13,
Line 59, "operation:" should read -- operation; --.

Signed and Sealed this

Fifteenth Day of October, 2002

Attest:

Attesting Officer

JAMES E. ROGAN
Director of the United States Patent and Trademark Office